United States Patent [19]

Tamai et al.

[11] Patent Number: 5,030,835
[45] Date of Patent: Jul. 9, 1991

[54] ION IMPLANTATION CAPABLE OF UNIFORMLY INJECTING AN ION BEAM INTO A SUBSTRATE

[75] Inventors: Tadamoto Tamai, Tokyo; Junichi Murakami, Ehime, both of Japan

[73] Assignee: Sumitomo Eaton Nova Corporation, Tokyo, Japan

[21] Appl. No.: 439,537

[22] Filed: Nov. 21, 1989

[30] Foreign Application Priority Data

Nov. 21, 1988 [JP] Japan ................................ 63-292507

[51] Int. Cl.[5] .............................................. H01J 37/20
[52] U.S. Cl. .............................. 250/492.2; 250/453.1
[58] Field of Search ............ 250/492.21, 492.2, 492.3, 250/442.1, 453.1

[56] References Cited

U.S. PATENT DOCUMENTS 4,405,864  9/1983  del Rio ........................... 250/492.21
4,745,287  5/1988  Turner ............................ 250/492.21

Primary Examiner—Jack I. Berman
Attorney, Agent, or Firm—Burns, Doane, Swecker & Mathis

[57] ABSTRACT

In an ion implantation apparatus for injecting an ion beam into a substrate at a controllable incident angle, the substrate (13a) is supported by a supporting section which comprises a disc shaped plate (13) for locating the substrate thereon and an injecting chamber (11) for disposing the disc shaped plate therein. The substrate is irradiated by the ion beam. The ion implantation apparatus comprises a first controlling section (20, 23) and a second controlling section (34). The first controlling section controls the supporting section so as to change a location of the substrate in relation to the ion beam. The second controlling section controls supporting section so as to change the controllable incident angle relative to the ion beam.

4 Claims, 3 Drawing Sheets

ION IMPLANTATION CAPABLE OF UNIFORMLY INJECTING AN ION BEAM INTO A SUBSTRATE

BACKGROUND OF THE INVENTION

This invention relates to an ion implantation apparatus for injecting an ion beam into a substrate.

On injecting an ion beam into a substrate or a wafer, the substrate may be directed to the ion beam and two-dimensionally moved so that the substrate is entirely scanned by the ion beam.

In a conventional ion implantation apparatus of the type described, an ion beam is emitted onto a substrate along a predetermined direction which may be called an irradiating direction hereinunder. More particularly, the conventional implantation apparatus comprises a supporting section for supporting the substrate and a controlling section for controlling the supporting section to entirely irradiate the substrate by the ion beam.

The supporting section has a disc section for locating the substrate thereon. The disc section is controlled by the controlling section so that the substrate is scanned by the ion beam.

To this end, the disc section is rotated around a first axis parallel to the irradiating direction of the ion beam. Furthermore, the disc section is slidably moved along a second axis substantially perpendicular to the first axis. Thus, the substrate can be entirely irradiated by the ion beam.

In this event, it is to be noted that the ion beam is emitted to the substrate at an invariable incident angle in the conventional ion implantation apparatus. For example, such an invariable incident angle may be a right angle. At any rate, the ion beam is kept at a constant angle.

However, it has been found out that the conventional implantation apparatus is not sufficient to uniformly inject the ion beam to a whole of the substrate.

SUMMARY OF THE INVENTION

It is an object of the invention to provide an ion implantation apparatus which is capable of changing an incident angle of an ion beam to a substrate.

It is another object of the invention to provide an ion implantation apparatus which is capable of injecting the ion beam to a whole of the substrate.

An ion implantation apparatus to which this invention is applicable is for injecting an ion beam into a substrate at a controllable incident angle and comprises supporting means for supporting the substrate so that the substrate is irradiated by the ion beam and first controlling means mechanically coupled to the supporting means for controlling the supporting means to change a location of the substrate in relation to the ion beam. According to this invention, the ion implantation apparatus further comprises second controlling means mechanically coupled to the supporting means for controlling the controllable incident angle relative to the ion beam.

DESCRIPTION OF THE PREFERRED EMBODIMENT

Figure 1:
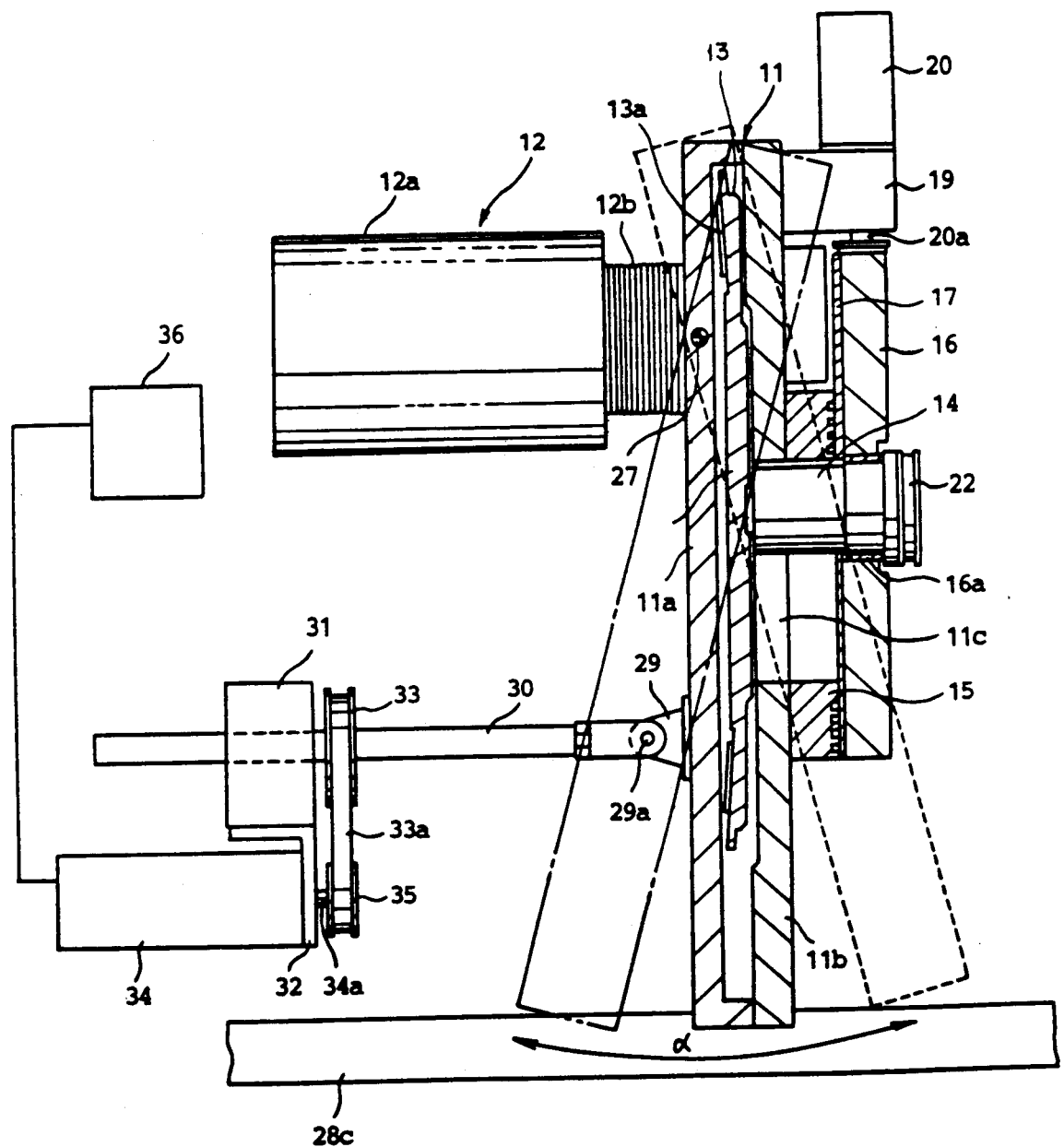
FIG. 1 is a side view, partially in section, of an ion implantation apparatus according to an embodiment of this invention.

Referring to FIG. 1, an ion implantation apparatus according to a preferred embodiment of this invention comprises an injecting chamber 11 defining an inner space. The inner space is kept at a vacuum. The injecting chamber 11 is coupled to an ion beam path 12. An ion beam is introduced into the injecting chamber 11 through the ion beam path 12. The ion beam path 12 is coupled to an ion accelerator (not shown) which is coupled to an ion source (not shown). Ions are given to the ion accelerator from the ion source and are accelerated into accelerated ions. The accelerated ions may include impure ions which are undesired for injection. To this end, the ion beam path 12 has a mass separator 12a. The mass separator 12a is for use in removing impure ions from the accelerated ions and produces the ion beam. The mass separator 12a is coupled to the injecting chamber 11 through a flexible tube 12b of, for example, a bellows type.

The injecting chamber 11 comprises a chamber portion 11a and a cover portion 11b. The cover portion 11b is attached to the chamber portion 11a so as to form the inner space in the injecting chamber 11. The cover portion 11b has an inner surface and an outer surface faced leftwards and rightwards of FIG. 1, respectively. An opening 11c is formed at the central part of the cover portion 11b and extends upwards and downwards of FIG. 1.

A disc shaped plate 13 is disposed in the inner space of the injecting chamber 11. The disc shaped plate 13 has a diameter of, for example, 50 cm. The disc shaped plate 13 has front and back surfaces which are directed leftwards and rightwards of FIG. 1, respectively. A plurality of wafers 13a are located on the front surface of the disc shaped plate 13 at a predetermined arrangement. For example, the wafers 13a are arranged along a predetermined circumference on the front surface of the disc shaped plate 13. The disc shaped plate 13 has a rotating axis member 14 which is protruded rightwards of FIG. 1 through the opening 11c and which is connected to the back surface of the disc shaped plate 13.

Figure 2:
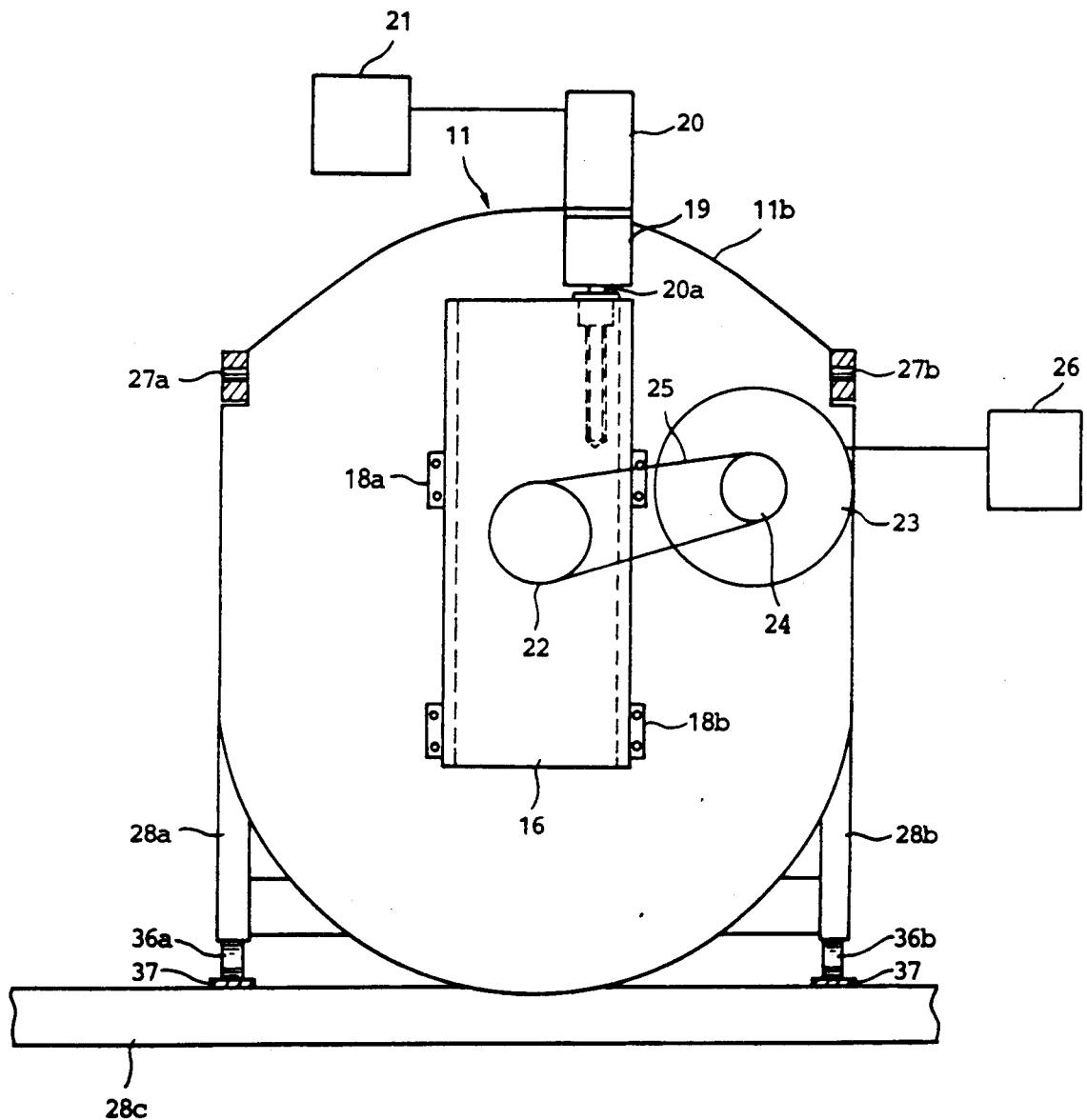
FIG. 2 is a right side view of the ion implantation apparatus illustrated in FIG. 1.

Referring to FIG. 2 together with FIG. 1, a sealing plate 15 is fixedly attached to the outer surface of the cover portion 11b so as to surround the opening 11c. A scanning plate 16 is located at the outer surface of the sealing plate 15 in FIG. 1. The scanning plate 16 is slidably attached to the sealing plate 15 through a mechanical seal 17. As a result, the scanning plate 16 is able to move upwards and downwards of FIG. 1. The rotating axis member 14 is protruded through the scanning plate 16 and is rotatably supported in the scanning plate 16 through a bearing member 16a. In this case, the sealing plate 15 and the mechanical seal 17 may construct a sealing mechanism for keeping the injecting chamber 11 at a vacuum.

As shown in FIG. 2, the cover portion 11b has a pair of linear guide members 18a and 18b which extend upwards and downwards of FIG. 2 and which are attached to the outer surface of the cover portion 11b. The scanning plate 16 is supported on the linear guide members 18a and 18b and slides upwards and downwards of FIG. 2 along the linear guide members 18a and 18b.

The cover portion 11b has a bracket member 19 located above the scanning plate 16. The bracket member 19 is attached on the outer surface of the cover portion 11b at its one end and extends rightwards of FIG. 1. A first servo motor 20 is placed on the bracket member 19. The first servo motor 20 has a first driving shaft 20a on which an external thread portion is formed. The first driving shaft 20a extends downwards of FIG. 1. The first servo motor 20 is controlled by a first servo controller 21 so that the first servo motor 20 is selectively turned into an on-state or an off-state.

The scanning plate 16 has an internal thread portion which is formed in the scanning plate 16. The internal thread portion extends downwards of FIG. 1. The external thread portion of the first driving shaft 20a is screwed into the internal thread portion of the scanning plate 16. Therefore, the scanning plate 16 is driven upwards and downwards of FIG. 1 by rotating the first driving shaft 20a when the servo motor 20 is put into the on-state.

As shown in FIG. 1, a first pulley 22 is attached to the outer end portion of the rotating axis member 14. In FIG. 2, a second servo motor 23 is mounted on the outer surface of the cover portion 11b. The second servo motor 23 may be mounted on the scanning plate 16. The second servo motor 23 has a second driving shaft (not shown) which extends from the back surface to the front surface of the sheet of FIG. 2. A second pulley 24 is fixedly mounted on the one end portion of the second driving shaft of the second servo motor 23. The second pulley 24 is connected to the first pulley 22 by a belt 25. The second servo motor 23 is controlled by a second servo controller 26 so that the second servo motor 23 is rotated at a predetermined rotating speed of, for example, 1000 r.p.m.

When the second servo motor 23 is driven by the second servo controller 26, rotating force is transmitted to the rotating axis member 14 through the pulley 24, the belt 25, and the pulley 23. As a result, the disc shaped plate 13 is rotated at the predetermined speed in the inner space of the injecting chamber 11.

Referring to FIG. 1 together with FIG. 2, the chamber portion 11a has first and second supporting members 27a and 27b which are attached to the lefthand side surface and the righthand side surface of the chamber portion 11a in FIG. 2. The first and the second supporting members 27a and 27b are supported by first and second supporting portions 28a and 28b, respectively, which extends downwards of FIG. 2 so that the injecting chamber 11 can swing around the first and the second supporting members 27a and 27b which are for use in a swing shaft depicted at 27. The first and the second supporting portions 28a and 28b may be fixed to a platform member 28c.

In FIG. 1, a connection member 29 is fixedly attached to the outer surface of the chamber portion 11a which faces leftwards of FIG. 1. A shaft member 30 is pivotally connected to the connection member 29 by a pivot pin 29a which extends from the back surface to the front surface of this sheet in FIG. 1. The connection member 29 is rotatable relative to the pivot pin 29a.

Referring to FIG. 1 again, the shaft member 30 extends from the lefthand side of FIG. 1 to the righthand side and is supported by a bracket member 31. As a result, the shaft member 30 can be moved leftwards and rightwards of FIG. 1. The bracket member 31 is attached to a supporting portion 32. The shaft member 30 has an external thread portion which is formed on its surface. The shaft member 30 is inserted to a third pulley 33. Namely, the third pulley 33 has an internal thread portion at its central part. The external thread portion of the shaft member 30 is screwed into the internal thread portion of the third pulley 33.

A third servo motor 34 is attached on the supporting portion 32 and has a third driving shaft 34a which passes through the supporting portion 32. A fourth pulley 35 is rotatably mounted on the one end of the third driving shaft 34a and is connected to the third pulley 33 by a belt member 33a. The third servo motor 34 is coupled to a third servo controller 36 and is controlled by the third servo controller 36.

Referring to FIGS. 1 and 2, description will be made as regards operation of the ion implantation apparatus according to this invention.

As described above, the ion beam is introduced into the injecting chamber 11 through the ion beam path 12. The ion beam is emitted into a plurality of wafers 13a which are arranged on the disc shaped plate 13. In order to entirely irradiate the wafers 35 by the ion beam, the first servo controller 21 delivers a forward driving command signal or a reverse driving command signal to the first servo motor 20. The first servo motor 20 is rotated forwards in response to the forward driving command signal. When the first servo motor 20 forwardly rotates, the scanning plate 16 is driven upwards of FIG. 1. The rotating axis member 14 moves upwards of FIG. 1 together with the scanning plate 16. As a result, the disc shaped plate 13 moves upwardly of FIG. 1. The upward movement of the disc shaped plate 13 is defined by the inner surface of the sealing plate 15.

On the other hand, the first servo motor 20 is responsive to the reverse driving command signal and reversely rotates when the first servo controller 21 produces the reverse driving command signal. When the first servo motor 20 reversely rotates, the scanning plate 16 is driven downwards of FIG. 1. The rotating axis member 14 moves downwards of FIG. 1 together with the scanning plate 16. As a result, the disc shaped plate 13 is driven downwards of FIG. 1. The downward movement of the disc shaped plate 13 is defined by the inner surface of the sealing plate 15.

When the second servo motor 26 delivers a rotating command signal to the second servo motor 23, the second servo motor 23 rotates the predetermined rotating speed, for example, 1000 r.p.m. As a result, the disc shaped plate 13 rotates around the rotating axis member 14 at the predetermined rotating speed.

As readily understood by the above description, the disc shaped plate 13 moves in relation to the ion beam, namely, the wafers 13a moves in relation to the ion beam. Therefore, the ion beam is substantially scanned on the wafers 13a. It is possible to entirely irradiate the wafers 13a by the ion beam.

As described above, the disc shaped plate 13 rotates and moves along a direction perpendicular to the direction of the ion beam. This means that the incident angle of the ion beam is a right angle. In this event, it is difficult to uniformly inject the ion beam to the whole of the wafer 13a.

On changing the incident angle of the ion beam relative to the wafers, the third servo controller 36 delivers an angle control signal to the third servo motor 34. The angle control signal is representative of a forward mode or a reverse mode of the third servo motor 34. When the angle control signal is representative of the forward mode, the third servo motor 34 forwardly rotates. The forward rotating force is transmitted to the third pulley 33 through the fourth pulley 35 and belt member 33a. As a result, the third pulley 33 forwardly rotates.

When the third pulley 33 forwardly rotates, the shaft member 30 moves rightwards of FIG. 1 since the bracket member 31 hinders the rotation of the shaft member 30. The injecting chamber 11 is pushed rightwards of FIG. 1. As a result, the injecting chamber 11 is swung around the swing axis. For example, the injecting chamber 11 is positioned at a first location shown by a broken line in FIG. 1. The disc shaped plate 13 is swung together with the injecting disc chamber 11. Therefore, the incident angle of the ion beam is changed to a first angle less than a right angle.

On the other hand, the third servo motor 34 reversely rotates when the angle control signal is representative of the reverse mode. When the third servo motor 34 reversely rotates, the shaft member 30 moves leftwards of FIG. 1. As a result, the injecting chamber 11 is swung around the swing axis. For example, the injecting chamber 11 is positioned at a second location shown by a dot-and-dash line in FIG. 1. Therefore, the incident angle of the ion beam is changed to a second angle greater than a right angle. A swing angle of the injecting chamber 11 is defined within an angle range depicted by $\alpha$.

As described above, the ion beam is able to be irradiated from various directions since the incident angle of the ion beam is variable. Therefore, the ion beam is uniformly injected into the wafer 13a.

Figure 3:
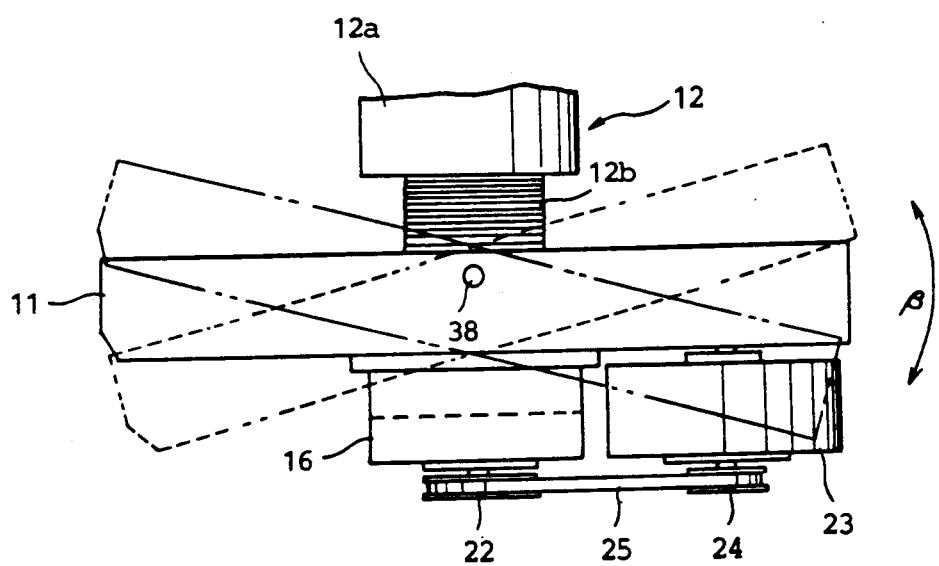
FIG. 3 is a partial plan view of the ion implantation apparatus illustrated in FIG. 1.

Referring to FIG. 3 together with FIG. 2, first and second roller members 36a and 36b may be attached to the down ends of the first and the second supporting portions 28a and 28b, respectively. An arc shaped rail member 37 is laid on the platform member 28c. The first and the second roller members 36a and 36b are positioned on the arc shaped rail member 37. The first and the second roller members 36a and 36b are able to be moved on the arc shaped rail member 37. Therefore, when the first and the second supporting portions 28a and 28b move along the arc shaped rail member 37, the injecting chamber 11 swings around another swing axis which is directed upwards and downwards of FIG. 3. The other swing axis is depicted by 38. The swing angle may be defined by a range depicted by $\beta$. For example, the injecting chamber 11 is swung at a third location shown by a broken line in FIG. 3. In addition, the injecting chamber 11 is swung at a fourth location shown by a dot-and-dash line in FIG. 3.

What is claimed is:

1. An ion implantation apparatus for injecting an ion beam into a substrate at a controllable incident angle, said ion beam being irradiated towards a predetermined direction, comprising:

supporting means for supporting said substrate so that said substrate is irradiated by said ion beam comprising a disc section for locating said substrate thereon, first means mechanically coupled to said disc section for rotatably supporting said disc section around a first axis parallel to said predetermined direction; and second means mechanically coupled to said first means for slidably supporting said disc section so as to move said disc section along a second axis substantially perpendicular to said predetermined direction;

first controlling means mechanically coupled to said supporting means for controlling said supporting means to change a location of said substrate in relation to said ion beam comprising first rotating means coupled to said first means for rotating said disc section around said first axis and driving means coupled to second means for driving said disc section along said second axis; and second controlling means mechanically coupled to said supporting means for controlling said controllable incident angle relative to said ion beam comprising second rotating means for rotating said disc section within a predetermined range around a third axis substantially perpendicular to said predetermined direction and said second axis and third rotating means for rotating said disc section within a prescribed range around said second axis.

2. An ion implantation apparatus for use in injecting an ion beam into a substrate, comprising:

an injection chamber for defining an inner space having a chamber portion and a cover portion which is attached to said chamber portion and which has an opening part;

ion beam injecting means coupled to the chamber portion of said injection chamber for injecting said ion beam into said inner space along an ion beam direction;

a disc shaped plate disposed in said inner space of the injection chamber for supporting said plurality of the substrates with said plurality of the substrates directed towards said ion beam, said disc shaped plate having a rotating axis member extended through said opening part;

a sealing member fixed to said cover portion for sealing said opening part and said rotating axis member to keep said injecting chamber at a vacuum;

a scanning member attached to said sealing member for sliding said scanning member together with said rotating axis member in a sliding direction perpendicular to said ion beam direction within a range determined by said opening part;

a first driving member coupled to said scanning member for moving said scanning member in said sliding direction so as to shift said disc shaped plate within said inner space in said sliding direction;

a second driving member coupled to said rotating axis member for rotating said rotating axis member to revolve said disc shaped plate within said inner space of the injection chamber;

a support member for supporting said injection chamber, said support member being attached to a pair of side ends of said injection chamber along a pivot axis that is perpendicular both to said ion beam direction and said sliding direction;

a connection member fixed to the chamber portion of said injection chamber and remote from said support member; and a third drive member for swinging said injection chamber within a predetermined range around said support member to control an angle of said ion beam relative to said substrates.

3. An ion implantation apparatus in accordance with claim 2, further comprising a fourth driving member for swinging said injection chamber around a pivot axis parallel to said sliding direction.

4. An ion implantation apparatus in accordance with claim 3, wherein said injection chamber is supported through said support member on a pair of roller members and each of said roller members are received by a rail, each rail having an arc-shape for guiding said roller members during swinging motion of said injection chamber by said fourth driving member.

* * * * *